United States Patent [19]

Ngan et al.

[11] Patent Number: 5,882,399
[45] Date of Patent: Mar. 16, 1999

[54] METHOD OF FORMING A BARRIER LAYER WHICH ENABLES A CONSISTENTLY HIGHLY ORIENTED CRYSTALLINE STRUCTURE IN A METALLIC INTERCONNECT

[75] Inventors: Kenny King-tai Ngan, Fremont; Barry Hogan, Santa Clara; Seshadri Ramaswami, San Jose, all of Calif.

[73] Assignee: Applied Materials, Inc., Santa Clara, Calif.

[21] Appl. No.: 924,487

[22] Filed: Aug. 23, 1997

[51] Int. Cl.$^6$ ........................................ C30B 6/00
[52] U.S. Cl. .................... 117/89; 117/939; 117/949; 117/103; 438/648
[58] Field of Search .................. 438/648, 652, 438/656, 622, 373, 766; 117/89, 92, 939, 949, 103, 105

[56] References Cited

U.S. PATENT DOCUMENTS

| | | | |
|---|---|---|---|
| 4,514,437 | 4/1985 | Nath | 427/39 |
| 4,911,894 | 3/1990 | Retallick et al. | 422/174 |
| 4,944,961 | 7/1990 | Lu et al. | 427/38 |
| 4,990,229 | 2/1991 | Campbell et al. | 204/298.06 |
| 5,108,951 | 4/1992 | Chen et al. | 437/187 |
| 5,141,897 | 8/1992 | Manocha et al. | 437/228 |
| 5,186,718 | 2/1993 | Tepman et al. | 29/25.01 |
| 5,236,868 | 8/1993 | Nulman | 437/190 |
| 5,262,361 | 11/1993 | Cho et al. | 437/245 |
| 5,288,665 | 2/1994 | Nulman | 437/194 |
| 5,320,728 | 6/1994 | Tepman | 204/192.12 |
| 5,346,600 | 9/1994 | Nieh et al. | 204/192.3 |
| 5,360,524 | 11/1994 | Hendel et al. | 204/192.25 |
| 5,364,664 | 11/1994 | Tsubouchi et al. | 427/535 |
| 5,371,042 | 12/1994 | Ong | 437/194 |
| 5,374,592 | 12/1994 | MacNaughton et al. | 437/194 |
| 5,391,517 | 2/1995 | Gelatos | 437/190 |
| 5,420,072 | 5/1995 | Fiordalice | 437/192 |
| 5,464,666 | 11/1995 | Fine et al. | 427/576 |
| 5,472,912 | 12/1995 | Miller | 437/194 |
| 5,497,025 | 3/1996 | Wong | 257/435 |
| 5,521,120 | 5/1996 | Nulman | 437/190 |
| 5,523,259 | 6/1996 | Merchant | 437/190 |
| 5,525,837 | 6/1996 | Choudhury | 257/751 |
| 5,526,951 | 6/1996 | Bailey et al. | 216/24 |
| 5,543,357 | 8/1996 | Yamada et al. | 437/192 |
| 5,571,752 | 11/1996 | Chen et al. | 437/189 |
| 5,627,102 | 5/1997 | Shinriki | 437/192 |
| 5,670,420 | 9/1997 | Choi | 437/189 |

OTHER PUBLICATIONS

"Tin formed by evaporation as a diffusion barrier between Al and Si" (J. Vac. Sci Technol. 21 (1) May/Jun. 1982) Ting pp. 14–17.

Primary Examiner—R. Bruce Breneman
Assistant Examiner—Shamim Ahmed
Attorney, Agent, or Firm—Shirley L. Church

[57] ABSTRACT

The aluminum <111> crystal orientation content of an aluminum interconnect layer or the copper <111> crystal orientation content of a copper interconnect can be maintained at a consistently high value during the processing of an entire series of semiconductor substrates in a given process chamber. To provide the stable and consistent aluminum <111> content, or the stable and consistent copper <111> content, it is necessary that the barrier layer structure underlying the aluminum or the copper have a consistent crystal orientation throughout the processing of the entire series of substrates, as well. We have determined that to ensure the consistent crystal orientation content of the barrier layer structure, it is necessary to form the first layer of the barrier layer structure to have a minimal thickness of at least about 150 Å, to compensate for irregularities in the crystal orientation which may by present during the initial deposition of this layer. As an alternative to increasing the thickness of the first layer of the barrier layer structure, this first layer can be deposited a low process chamber pressure, so that harmful irregularities in the crystal orientation are eliminated.

30 Claims, 4 Drawing Sheets

METHOD OF FORMING A BARRIER LAYER WHICH ENABLES A CONSISTENTLY HIGHLY ORIENTED CRYSTALLINE STRUCTURE IN A METALLIC INTERCONNECT

BACKGROUND OF THE INVENTION

1. Field of the Invention

The present invention pertains to a method of forming a titanium-comprising or a tantalum-comprising barrier/wetting layer structure. This structure is useful when a series of semiconductor substrates is to be fabricated in a process chamber, as it enables a consistently high degree of <111> crystal orientation in an aluminum interconnect layer or a copper interconnect layer deposited over such a barrier/wetting layer structure, throughout the processing of the series of substrates.

2. Brief Description of the Background Art

Titanium nitride layers have been used in semiconductor device structures as barrier layers for preventing the interdiffusion of adjacent layers of materials such as aluminum and silicon, for example. However, the crystal orientation of aluminum deposited over the surface of the titanium nitride barrier layer is typically polycrystalline, and polycrystalline aluminum has poor electromigration resistance.

In the formation of integrated circuit interconnect structures, such as a Ti/TiN/TiN$_x$/Al stack, electromigration of aluminum atoms within the aluminum layer becomes a problem if the aluminum layer is not formed with a high degree of <111> crystal orientation. Electromigration of the aluminum atoms can result in open circuits within the integrated circuit structure, and therefore, such electromigration must be inhibited or eliminated. Electromigration of aluminum atoms can occur within filled vias as well, impairing the conductivity of the contacts.

U.S. Pat. No. 4,944,961 to Lu et al., issued Jul. 31, 1990, describes a process for partially ionized beam deposition of metals or metal alloys on substrates, such as semiconductor wafers. Metal vaporized from a crucible is partially ionized at the crucible exit, and the ionized vapor is drawn to the substrate by an imposed bias. Control of substrate temperature is said to allow non-conformal coverage of stepped surfaces such as trenches or vias. When higher temperatures are used, stepped surfaces are planarized. The examples given are for aluminum deposition, where the non-conformal deposition is carried out with substrate temperatures ranging between about 150° C. and about 200° C., and the planarized deposition is carried out with substrate temperatures ranging between about 250° C. and about 350° C.

S. M. Rossnagel and J. Hopwood describe a technique of combining conventional magnetron sputtering with a high density, inductively coupled RF plasma in the region between the sputtering cathode and the substrate in their 1993 article titled "Metal ion deposition from ionized magnetron sputtering discharge", published in the J. Vac. Sci. Technol. B. Vol. 12, No. 1, Jan/Feb 1994. One of the examples given is for titanium nitride film deposition using reactive sputtering, where a titanium cathode is used in combination with a plasma formed from a combination of argon and nitrogen gases.

U.S. Pat. No. 5,262,361 to Cho et al., issued Nov. 16, 1993 describes a method for forming single crystal aluminum films on the surface of a substrate such as silicon (111). The object is to increase the amount of the aluminum (111) crystal orientation, to improve the electromigration resistance of the aluminum. Electrically neutral aluminum is deposited by a vacuum evaporation technique upon a silicon wafer surface at a temperature ranging between about 300° C. and about 400° C.

U.S. Pat. No. 5,543,357 to Yamada et al., issued Aug. 6, 1996, describes a process for manufacturing a semiconductor device wherein a titanium film is used as an under film for an aluminum alloy film to prevent the device characteristics of the aluminum alloy film from deteriorating. The thickness of the titanium film is set to 10% or less of the thickness of the aluminum alloy film and at most 25 nm. In the case of the aluminum alloy film containing no silicon, the titanium film is set to 5% of less of the thickness of the aluminum alloy film. The aluminum film is formed at a substrate temperature of 200° C. or less by a sputtering process, and when the aluminum film or an aluminum alloy film is to fill a via hole, the substrate is heated to fluidize the aluminum. The pressure during the aluminum film formation and during the fluidization is lower than $10^{-7}$ Torr. A titanium nitride barrier layer may be applied on an interlayered insulating film (or over a titanium layer which has been applied to the insulating film), followed by formation of a titanium film over the titanium nitride film, and finally by formation of the aluminum film over the titanium film. After formation of the titanium nitride barrier layer, the barrier layer is heated to a temperature of about 600° C. to 700° C. in a nitrogen atmosphere using a halogen lamp so that any titanium which is not nitrided will become nitrided. The titanium nitride barrier layer is said to be a poor barrier layer if un-nitrided titanium is present within the layer.

U.S. Pat. No. 5,571,752 to Chen et al., issued Nov. 5, 1996, discloses a method for patterning a submicron semiconductor layer of an integrated circuit. In one embodiment, titanium or titanium nitride having a thickness of between approximately 300 and 2000 Å is formed by sputter deposition to reach the bottom of a contact opening. The barrier layer may be annealed to form a silicide in the bottom of the opening. A conformal conductive layer of a refractory metal or refractory metal silicide is formed over the titanium or titanium nitride using chemical vapor deposition (CVD). Finally, a second conductive layers typically aluminum is applied over the surface of the conformal conductive layer. The aluminum is sputtered on, preferably at a temperature ranging between approximately 100° C. and 400° C. This method is said to make possible the filling of contact openings having smaller device geometry design requirements by avoiding the formation of fairly large grain sizes in the aluminum film.

U.S. patent application, Ser. No. 08/753,251 of Ngan et al., filed Nov. 21, 1996, describes a method for producing a titanium nitride-comprising barrier layer on the surface of a contact via. For certain contact geometries, when the reactor pressure is reduced during formation of the titanium nitride-comprising barrier layer, the thickness of the barrier layer on the sidewalls of the via increases. This enables an aluminum fill to travel along the sidewalls of the via more easily, resulting in a better fill of the via. In particular, the titanium nitride comprising barrier layer needs to be of a minimum thickness and to have a minimum titanium content so that the barrier layer can react slightly with the Aluminum, to draw the aluminum along the sidewalls of the via.

U.S. patent application, Ser. No. 08/511,825 of Xu et al., filed Aug. 7, 1995, assigned to the Assignee of the present invention, and hereby incorporated by reference in its entirety, describes a method of forming a titanium nitride-comprising barrier layer which acts as a carrier layer. The carrier layer enables the filling of apertures such as vias, holes or trenches of high aspect ratio and the planarization of a conductive film deposited over the carrier layer at reduced temperatures compared to prior art methods.

A "traditionally sputtered" titanium nitride-comprising film or layer is deposited on a substrate by contacting a titanium target with a plasma created from an inert gas such as argon in combination with nitrogen gas. A portion of the titanium sputtered from the target reacts with nitrogen gas which has been activated by the plasma to produce titanium nitride, and the gas phase mixture contacts the substrate to form a layer on the substrate. Although such a traditionally sputtered titanium nitridecomprising layer can act as a wetting layer for hot aluminum fill of contact vias, good fill of the via generally is not achieved at substrate surface temperature of less than about 500° C. To provide for aluminum fill at a lower temperature, Xu et al. (as described in U.S. patent application, Ser. No. 08/511,825), developed a technique for creating a titanium nitride-comprising barrier layer which can act as a smooth carrier layer, enabling aluminum to flow over the barrier layer surface at lower temperatures (at temperatures as low as about 350° C., for example). A typical barrier layer described by Xu et al., is a combination of three layers including a first layer of titanium (Ti) deposited over the surface of the via; a second layer of titanium nitride (TiN) is deposited over the surface of the first titanium layer; finally a layer of $TiN_x$ is deposited over the TiN second layer. The three layers are deposited using Ion Metal Plasma (IMP) techniques which are described subsequently herein. Typically the first layer of titanium is approximately 100 Å to 200 Å thick; the second layer of TiN is about 800 Å thick, and the third layer of $TiN_x$ is about 60 Å thick. Although a good fill of contact vias having 0.25μ diameter through holes having an aspect ratio of about 5 was achieved, the crystal orientation of the aluminum was low in {111} crystal orientation content, resulting in poor electromigration (EM) performance for the aluminum interconnect. It was desired to increase the aluminum {111} crystal orientation content for purposes of improving the EM performance.

U.S. patent application, Ser. No. 08/825,216 of Ngan et al., filed Mar. 27, 1997, discloses various process techniques which can be used to control the crystal orientation of a titanium nitride barrier layer as it is deposited.

U.S. patent application, Ser. No. 08/824,911 of Ngan et al., filed Mar. 27, 1997 discloses improved $Ti/TiN/TiN_x$ barrier/wetting layer structures which enable the aluminum filling of high aspect vias while providing an aluminum fill exhibiting a high degree of aluminum {111} crystal orientation. In particular, an improved $Ti/TiN/TiN_x$ barrier layer deposited using IMP techniques can be obtained by increasing the thickness of the first layer of Ti to range from greater than about 100 Å to about 500 Å (the feature geometry controls the upper thickness limit); by decreasing the thickness of the TiN second layer to range from greater than about 100 Å to less than about 800 Å (preferably less than about 600 Å); and, by controlling the application of the $TiN_x$ third layer to provide a Ti content ranging from about 50 atomic percent titanium (stoichiometric) to about 100 atomic percent titanium. Preferably the $TiN_x$ third layer is formed at the end of the deposition of the TiN second layer and exhibits a Ti content gradient which begins at a stoichiometric, 50 atomic percent, Ti content and ends at a Ti content of about 100 atomic percent. The thickness of the $TiN_x$ third layer preferably ranges from about 15 Å to about 500 Å. The improved $Ti/TiN/TiN_x$ barrier layer enables the deposit of an aluminum interconnect an aluminum via fill where the aluminum exhibits a high {111} crystallographic content.

U.S. patent application, Ser. No. 08/824,911 is hereby incorporated herein by reference, in its entirety.

Subsequent to the filing of U.S. patent application Ser. No. 08/824,911, we discovered that in a production simulation, with a cassette containing a large quantity of semiconductor wafers processed in series in a given process chamber, there were unknown factors present at the beginning of processing which affected the <111> crystal orientation of the aluminum layer. Although the method provided in U.S. patent application Ser. No. 08/824,911 enables the deposit of a high <111> crystallographic aluminum content, to ensure a consistently high aluminum <111> content throughout the processing of a large number of semiconductor substrates, it is necessary to either eliminate the unknown factors affecting the crystalline structure or to find a way to compensate for them.

SUMMARY OF THE INVENTION

The crystal orientation content of a metallic interconnect layer, such as the <111> crystal orientation content of an aluminum or copper interconnect layer, can be maintained at a consistently high value during the processing of an entire series of semiconductor substrates in a given process chamber. To provide the stable and consistent crystal orientation content for the metallic interconnect layer, it is necessary that the barrier layer structure underlying the metallic interconnect layer have a consistent crystal orientation. This means the barrier layer structure crystal orientation content must remain consistent throughout the processing of the entire series of substrates in a given process chamber. We have determined that to ensure the consistent crystal orientation content of the barrier layer structure, it is necessary to form the first layer of the barrier layer structure to have a minimal thickness of at least about 150 Å, to compensate for irregularities in the crystal orientation which may by present during the initial deposition of this layer.

As an alternative to increasing the thickness of the first layer of the barrier layer structure, this first layer can be deposited at lower process chamber pressures, so that harmful irregularities in the crystal orientation are eliminated.

By forming the first layer of the barrier layer using one of the alternative means described above, we were able to obtain the desired <111> crystal orientation content of an aluminum interconnect layer throughout the processing of an entire cassette of at least 25 wafers in a given process chamber.

The above described method has been demonstrated for a $Ti/TiN/TiN_x$ barrier layer and is expected to produce equivalent results for a $TiN/TiN_x$ barrier layer as well. Further, we would expect the method to apply to a tantalum-comprising barrier layer used in combination with an overlying copper interconnect layer. In this latter case, the barrier layer structure, whether it be a Ta layer, a TaN layer, a $TaN_x$ layer, or a combination thereof, should be deposited in the manner described, to ensure a high <111> crystal orientation content in each of these barrier layers. This will provide for a high <111> crystal orientation content in the copper layer deposited over the barrier layer.

DETAILED DESCRIPTION OF THE PREFERRED EMBODIMENTS

Figure 1:
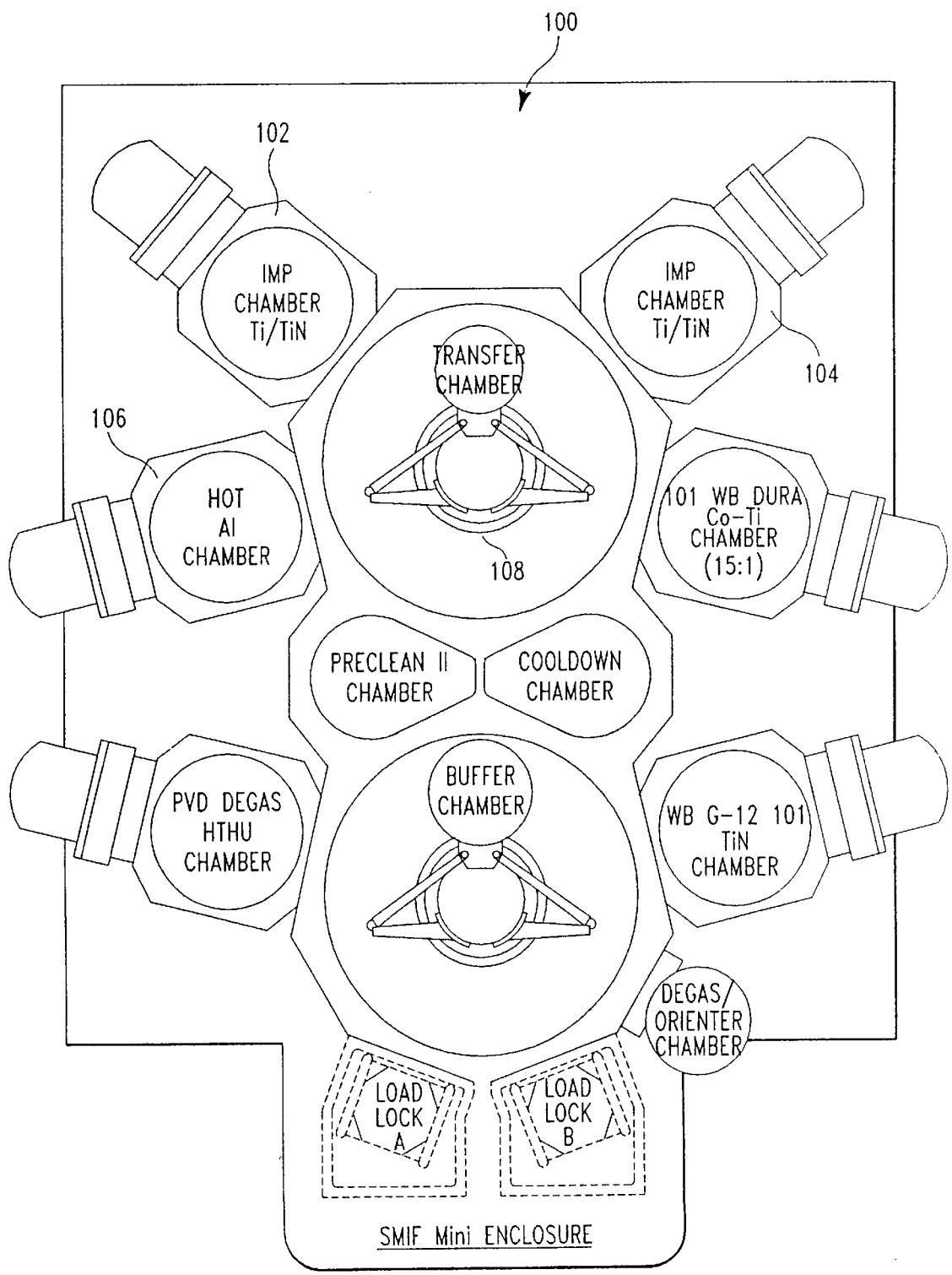
FIG. 1 shows a schematic of an ENDURA® semiconductor processing system of the kind available from Applied Materials, Inc. of Santa Clara, Calif.

This disclosure pertains to a method of ensuring that the desired crystal orientation content of a metallic interconnect layer remains consistently high during the processing of an entire series of semiconductor substrates in a given process chamber. To provide the consistent crystal orientation content of the metallic interconnect layer, it is necessary to form the first layer of an underlying barrier layer structure to a minimal thickness of at least 150 Å, to compensate for irregularities in the crystal orientation which may by present during the initial deposition of this layer. In the alternative, this first layer can be less than the minimal thickness specified above if it is deposited at a sufficiently low process chamber pressure.

I. DEFINITIONS

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF glow discharge, reference to "the contact material" includes aluminum, aluminum alloys, and other conductive materials which have a melting point enabling them to be sputtered over the temperature range described herein.

Specific terminology of particular importance to the description of the present invention is defined below.

The term "aluminum" includes alloys of aluminum of the kind typically used in the semiconductor industry. Such alloys include aluminum-copper alloys, and aluminum-copper-silicon alloys, for example. The preferred embodiments described herein were for aluminum comprising about 0.5% copper.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal travel width of the trench at its base.

The term "feature" refers to contacts, vias, trenches, and other structures which make up the topography of the substrate surface.

The term "ion-deposition sputtered" and the term "ion metal plasma (IMP) refer to sputter deposition, preferably magnetron sputter deposition (where a magnet array is placed behind the target). A high density, inductively coupled RF source is positioned between the sputtering cathode and the substrate support electrode, whereby at least a portion of the sputtered emission is in the form of ions at the time it reaches the substrate surface.

The term "normalized" refers to a method by which one or more sets of figures are scaled appropriately in order to describe or explain any relationships between the figures. A common approach, as is used here, is to normalize to "1". This is achieved by selecting the highest value in a data set and then dividing all numbers in the data set by this value. By applying this approach to two or more data sets, a graph can be produced which shows the relative change in values between the data sets.

The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

The term "traditionally sputtered aluminum" refers to aluminum applied using traditional sputtering techniques, where the substrate temperature during application of the aluminum ranges between about 200° C. to about 550° C., unless specified otherwise.

The term "XRD" (X-ray Diffraction) refers to a technique commonly used to measure crystalline orientation, wherein radiation over particular wavelengths is passed through the material to be characterized, and the diffraction of the radiation, caused by the material through which it passes, is measured. A map is created which shows the diffraction pattern, and the crystal orientation is calculated based on this map.

II. AN APPARATUS FOR PRACTICING THE INVENTION

A process system in which the method of the present invention may be carried out is the ENDURA® Integrated Processing System available from Applied Materials, Inc. of Santa Clara, Calif. This process system 100 is shown in the FIG. 1. Of particular interest are individual processing chambers which would be used in the practice of the present invention. Process chamber 102 is used for the IMP deposition of a barrier layer such as a Ti/TiN/TiN$_x$ layer. Process chamber 104 is similar to process chamber 102. Process chamber 106 is used for traditional sputtering of an aluminum layer, and transfer chamber 108 is a process chamber which enables movement of a substrate from one of the surrounding process chambers to another.

For example, after deposition of a Ti/TiN/TiN$_x$ barrier layer in process chamber 102, a substrate is moved through transfer chamber 108 to process chamber 106 for sputtering of an overlying aluminum film.

Process chamber 102 is typically is a magnetron chamber which employs a standard sputter magnet (to confine the sputtering plasma, enabling an increased sputtering rate); an inductively coupled RF source positioned between the sputtering cathode and the substrate support electrode, whereby at least a portion of the sputtered emission is in the form of ions at the time it reaches the substrate surface; and a sputtering target cathode to which DC power is applied.

EXAMPLE ONE

To form the Ti/TiN/TiN$_x$ barrier layer structure of the present invention, a titanium target cathode of about 14 inches (35.5 cm) in diameter was used, and a DC power was applied to this cathode over a range from about 4 kW to about 8 kW. The substrate, comprising an 8 inch (20.3 cm) diameter silicon wafer, was placed a distance of about 5.5 inches (14 cm) from the target cathode. A high density, inductively coupled RF plasma was generated in the region between the target cathode and the substrate. The inductively coupled plasma was generated by applying RF power to a coil having at least one turn and preferably from about 1 to 3 turns. The power was applied over a range from about 100 kHz to about 60 MHz (and preferably about 2 MHz) at a wattage ranging from about 0.5 kW to about 6 kW (and preferably ranging from about 1.5 kW to about 4 kW). Typically the coil is fabricated from metal tubing which permits water cooling, and has a diameter of about 0.125 inch (0.32 cm). However, the coil can be fabricated from a sheet or ribbon, or other form which provides the desired function.

A substrate bias voltage ranging from 0 to about −300 V DC may be applied to the substrate or to the platen on which the substrate sets. When a bias voltage is applied a D.C. substrate self bias is created which attracts ions from the plasma to the substrate.

III. THE STRUCTURE OF THE Ti/TiN/TiN$_x$ BARRIER LAYER

The typical barrier layer structure comprises a stack of three layers. In the more preferred embodiment, the first layer (applied directly over an underlying substrate such as silicon or silicon oxide) is ion-deposited titanium (Ti). The second layer, applied over the first layer, is ion-deposited titanium nitride (TiN). The third layer, applied over the second layer, is an ion-deposited layer, TiN$_x$, where the composition of the layer varies from about 50 atomic % titanium to about 100 atomic % titanium. Preferably the titanium concentration is a gradient beginning with essentially stoichiometric TiN and progressing toward pure Ti.

An electrical contact or conductive layer is applied over the barrier layer structure. Although the contact or conductive layer described herein is aluminum containing about 0.5% by weight copper, other conductive materials benefit from use of the smooth barrier layer structure described herein. The <111> crystallographic content of a subsequently applied conductive material can be adjusted using the concepts described herein. The aluminum deposited in the examples which follow was traditionally sputtered aluminum, applied over a temperature range of from about 350° C. to about 450° C. Preferably the aluminum is applied at reduced pressures ranging from greater than about 0.5 mT up to about 50 mT, preferably between about 1 mT and 30 mT, and more preferably between about 1 mT and 4 mT, depending on the feature to be fabricated.

Figure 2:
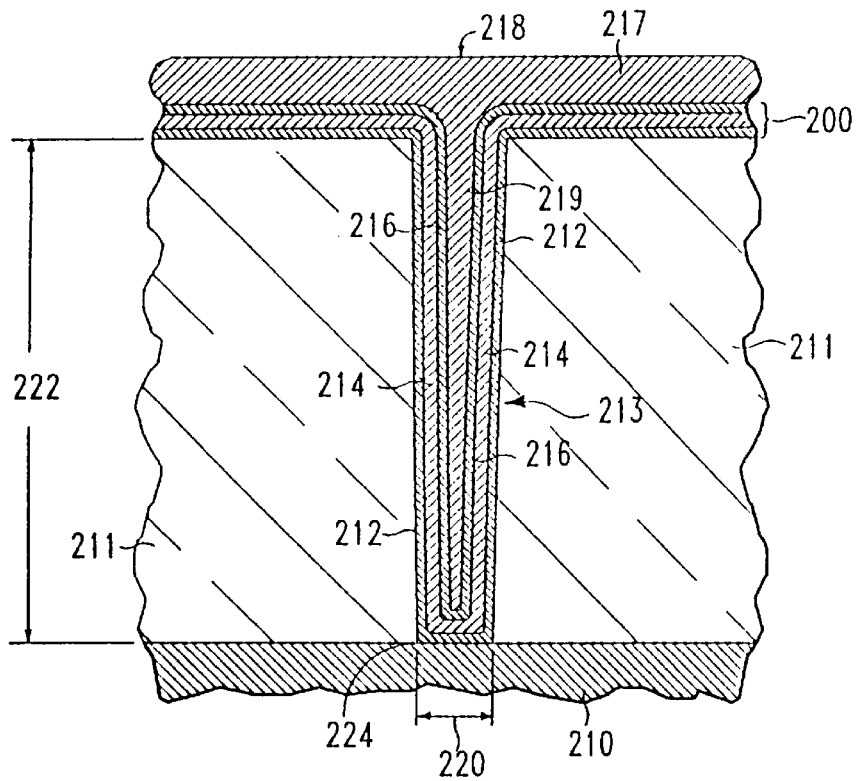
FIG. 2 illustrates a schematic of a conductive contact formed within a high aspect ratio via, and shows, in particular, a Ti/TiN/TiN$_x$ barrier layer of the kind described with reference to U.S. patent application, Ser. No. 08/824, 911.

FIG. 2 shows a schematic of a trench or via 213 containing a barrier layer structure 200 of the kind which would utilize the method of the present invention. The structure 200 was formed on a semiconductor substrate comprising a silicon base 210 having an overlying silicon dioxide layer 211. The via or trench 213 was created by dry etching through the silicon dioxide layer 211 to silicon base 210. Structure 200 comprised three layers: Ti/TiN/TiN$_x$. The first layer of titanium was IMP deposition sputtered upon the surface of both silicon dioxide layer 211 and silicon base 210; a second layer of reactive ion-deposition sputtered titanium nitride layer 214 was deposited overlying first titanium layer 212; and a third ion-deposition sputtered titanium nitride-comprising layer 216 was deposited overlying titanium nitride layer 214. (Upon ion-sputtering of titanium layer 212, a thin layer of titanium silicide 224 is typically formed at the bottom of via 213 upon high temperature annealing). Structure 200 was then filled with a conductive layer 219. The aspect ratio of via or trench 213 was as illustrated by the ratio of dimension 222 to dimension 220, and was approximately 20:1, with the dimension of 220 being approximately 0.25μ.

Aluminum was traditionally sputtered upon a structure 200 at a substrate temperature of about 400° C.

IV. THE METHOD OF APPLICATION OF BARRIER LAYERS AND ALUMINUM

The apparatus in which the preferred embodiments described herein were fabricated was the Endura® Integrated Processing System previously described and illustrated in FIG. 1.

EXAMPLE TWO

The description which follows pertains to the fabrication of the Ti/TiN/TiN$_x$ barrier layer described above.

To obtain an ion-deposition sputtering rate of about 700 Å per minute of Ti upon the surface of an 8 inch (20.3 cm) diameter substrate, typically about 2 MHz (≅2.5 kW) of RF power was applied to the induction coil while about 4 kW of DC power was applied to the titanium target cathode. No power was applied to the substrate platen electrode. The Ti deposition was carried out at about 30 mT. This pressure corresponded to an argon feed rate of about 65 sccm. The temperature on the substrate surface was about 200° C.

To obtain a reactive ion-deposition sputtering rate for TiN of about 250 Å per minute over the Ti first layer surface, typically about 2 MHz (2.5 kW) of RF power was applied to the induction coil while about 5 kW of DC power was applied to the titanium target cathode. Again, no power was applied to the substrate platen electrode. The TiN deposition was carried out at about 30 mT. This pressure corresponded to an argon feed rate of about 10 sccm and a nitrogen feed rate of about 70 sccm in the Applied Materials Endura®

Integrated Process System. The temperature on the substrate surface was about 200° C.

To obtain a reactive ion-deposition sputtering rate for $TiN_x$ of about 600 Å per minute upon the TiN second layer surface, the process conditions were set at those specified for the TiN second layer; however, at the beginning of the sputtering of the $TiN_x$ layer, the flow of nitrogen gas to the process chamber was discontinued. Since the titanium target becomes nitrided during the TiN deposition, TiN continues to be produced for a limited time period after the nitrogen gas flow is discontinued. Typically, under the operational conditions specified with reference to the TiN deposition, but with the flow of nitrogen gas to the chamber discontinued, the nitrided portion of the target is sputtered away within 5 to 10 seconds. The thicker the TiN second layer, the longer the time period before the nitrided portion of the target is sputtered away. In this particular instance, the $TiN_x$ layer deposition was carried out for a period ranging from about 30 to about 40 seconds after the flow of nitrogen to the process chamber was discontinued.

Subsequently an aluminum layer about 6,000 Å thick was sputtered upon the via surface using traditional sputtering techniques, a substrate temperature of about 400° C., and a pressure of about 2 mT. Complete via fill (with essentially no voids evidenced in the photomicrographs) was achieved for the contact vias using the Ti/TiN/$TiN_x$ barrier/wetting layer fabricated as described above.

EXAMPLE THREE

To obtain an aluminum fill of the via where the crystallographic <111> content is sufficiently high to prevent electromigration, the crystallographic structure of the underlying Ti/TiN/$TiN_x$ barrier layer 200 is critical, as the underlying $TiN_x$ <111> crystal orientation content is mirrored in the overlying aluminum {111} crystal orientation content.

Figure 3:
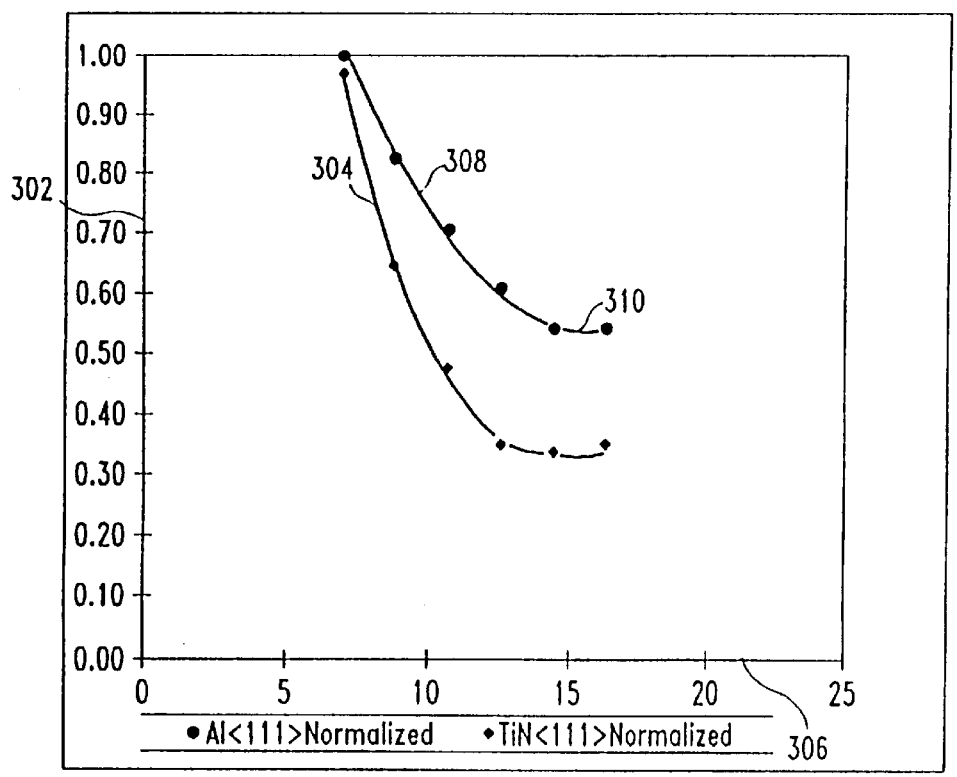
FIG. 3 shows the normalized X-ray diffraction (XRD) curve for an aluminum film and for the IMP-deposited TiN barrier layer over which the aluminum film was deposited, as a function of the number of wafers processed in succession in the barrier layer deposition chamber. These curves relate to a barrier layer which was processed outside the method of the present invention.

With reference to FIG. 3, An IMP-deposited Ti/TiN/$TiN_x$ barrier structure was prepared on a wafer surface, with the upper surface of the barrier layer being $TiN_x$. An aluminum layer was deposited over the barrier layer structure using traditional sputtering techniques. XRD readings were taken to determine the <111> crystal orientation for the $TiN_x$ layer and the aluminum layer.

The three layer Ti/TiN/$TiN_x$ structure from which the data for FIG. 3 was obtained was prepared as follows. A first layer of Ti was IMP deposited to a thickness of about 100 Å. The DC power to the Ti sputtering target was about 4 kW; the RF power to the inductively coupled IMP coil was about 2.5 kW; the argon flow rate to the deposition chamber was about 65 sccm; the pressure in the deposition chamber was about 30 mT; and the substrate temperature was about 200° C. No power was applied to the substrate support platen. A second layer of TiN was deposited over the Ti layer by reactive IMP deposition, where the conditions were generally the same as during the IMP deposition of the Ti layer, except that nitrogen was added to the deposition chamber at a flow rate of about 70 sccm, with the argon flow rate being 10 sccm. The thickness of the second layer of reactive ion-deposition sputtered TiN was about 250 Å. Subsequently a third layer of $TiN_x$ was applied over the TiN layer using IMP deposition. The $TiN_x$ layer was applied using the conditions used during the IMP deposition of the TiN layer, except that nitrogen flow was shut off after the formation of the TiN layer, and the IMP deposition was continued for an additional 40 seconds. (Residual nitrogen in the chamber and on the target surface was incorporated into the $TiN_x$ layer.) The resulting $TiN_x$ layer was approximately 400 Å thick. The composition of the $TiN_x$ layer ranged from 50 atomic % Ti initially to toward about 100 atomic % Ti toward the upper surface of the $TiN_x$ layer. The Aluminum was sputtered over the surface of the $TiN_x$ layer using traditional sputtering, at a temperature of about 400° C. and at a pressure of about 2 mT.

We discovered that during the processing of a cassette of 25 semiconductor wafers, the normalized <111> crystal orientation content, as represented by curve 304, of the $TiN_x$ layer decreased with each subsequent wafer processed. The normalized XRD intensity reading which is indicative of the <111> content of the $TiN_x$ layer is shown on scale 302, and the number of wafers processed is shown on scale 306. This decrease in normalized <111> crystal orientation content was mirrored in the overlying aluminum layer, which showed a decreasing normalized <111> crystal orientation content, represented by curve 308.

The first 7 wafers were "dummy wafers" processed to condition the process vessel, so no data is provided for these wafers. In fact, had the first seven wafers been used for data collection, curves 304 and 308 would be expected to show a decreasing <111> crystal orientation content over processing of the first 17 wafers. Obviously, such a decreasing <111> content cannot be tolerated, as it means that the electromigration of the aluminum is adversely impacted. Further, it means that the product is not consistent and that different performance may be expected for each wafer processed. Even if the {111} crystal orientation content 310 of the aluminum after stabilization were acceptable, no commercially acceptable process would provide for discarding of 17 of 25 wafers processed. We had to find a method for maintaining the aluminum layer <111> crystal orientation throughout wafer production.

Figure 4:
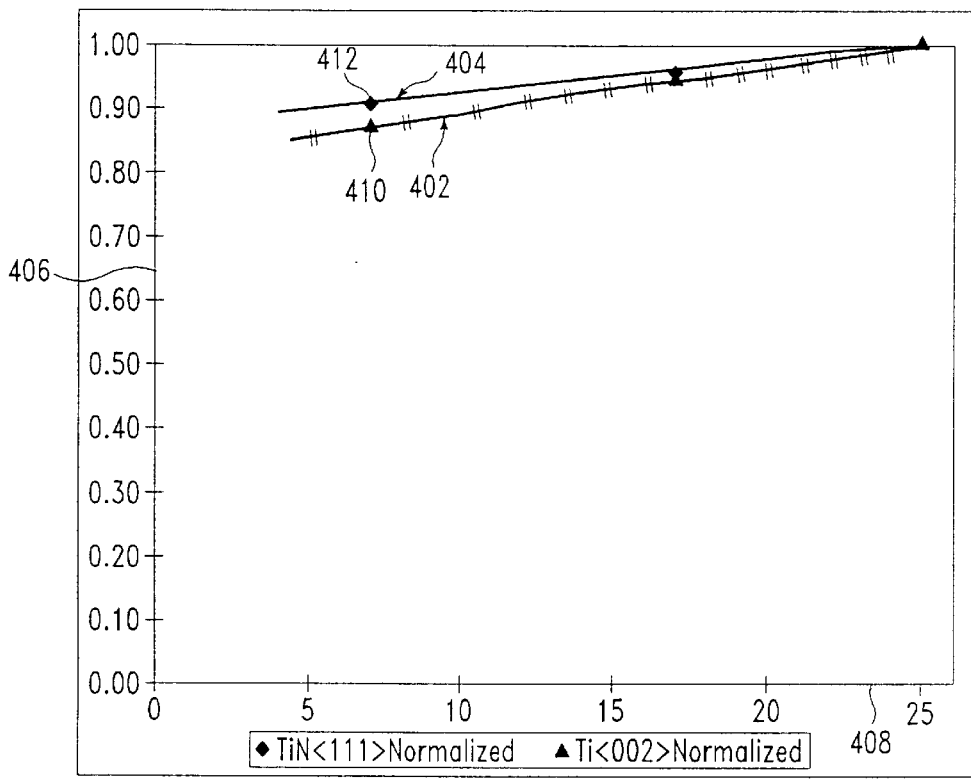
FIG. 4 shows the normalized XRD curve for an IMP-deposited TiN barrier layer and for the IMP-deposited Ti layer over which the TiN layer was deposited, as a function of the number of wafers processed in succession in the barrier layer deposition chamber. These curves relate to a barrier layer which was formed using the method of the present invention.

FIG. 4 shows the normalized XRD curves for the Ti first layer and for the TiN layer of a Ti/TiN/$TiN_x$ barrier layer. The Ti first layer <002> crystal orientation content, as represented by curve 402, and the TiN second layer <111> crystal orientation content, as represented by curve 404 increase as the number of wafers processed increases. The normalized crystal orientation XRD intensity reading is shown on scale 406, and the number of wafers processed is shown on scale 408. The improvement in crystal orientation of the Ti first layer is mirrored in the TiN layer. This improvement is an indication that there is a factor in the process chamber which causes irregularities in the crystal orientation of the forming barrier layers which is eliminated as additional processing is carried out in the deposition chamber. No aluminum layer was deposited over the surface of the barrier layer structure, as we wanted to have the clearest XRD possible for the structure.

With further reference to FIG. 4, the barrier layer structure was deposited under the same conditions as described for the barrier layer with reference to FIG. 3, except that the thickness of the first Ti layer was 200 Å thick. Due to the increased thickness (from 100 Å to 200 Å) of the first Ti layer, the normalized XRD intensity reading for the <002> crystal orientation of the first Ti layer is relatively high for the 8th wafer (again, the first 7 wafers were dummy wafers) at about 0.86, as shown on curve 402 at 410 and remains high for all 25 wafers processed. This high degree of <002> crystal orientation is mirrored in the overlying TiN layer which exhibits a relatively high <111> crystal orientation for the 8th wafer through the 25th wafer, as well. The TiN layer normalized XRD intensity reading for the <111> crystal orientation is about 0.89 for the 8th wafer, as illustrated at point 412 on curve 404. As will be shown subsequently with reference to FIG. 5, when the normalized XRD intensity reading for the TiN layer is about 0.89, the aluminum layer (overlying the Ti/TiN/TiN$_x$ barrier layer structure) <111> crystal orientation can be expected to have a normalized XRD intensity reading of about 1.0, indicating a very high <111> crystal orientation content for the aluminum layer.

The high and increasing <111> crystal orientation of the TiN layer illustrated graphically by curve 404 in FIG. 4 stands in stark contrast with the rapidly decreasing <111> crystal orientation of the TiN layer illustrated by curve 304 in FIG. 3. We attribute this unexpected difference in crystal orientation stability to the increase in the thickness of the first Ti layer from 100 Å to 200 Å. In view of this surprising result, we now believe that there is a minimum thickness which the first Ti layer must have to overcome irregularities in the crystal orientation of that layer caused by the presence of a factor in the deposition chamber (which factor is gradually eliminated as additional wafer processing is carried out in the chamber). We know that a 100 Å first Ti layer thickness is inadequate to overcome the effect of this unidentified species, but that a 200 Å thickness is adequate. Our present data indicates that a minimum first Ti layer thickness of about 150 Å is required to ensure an acceptable and constant <002> crystal orientation content for the first Ti layer.

EXAMPLE FOUR

We have also discovered that it is possible to obtain a high and constant aluminum <111> crystal orientation content when the first Ti layer thickness is 100 Å if an alternative method is used which provides for the elimination of the factor which causes the crystal orientation irregularities.

By reducing the pressure in the process chamber during the deposition of the first Ti layer, we have apparently been able to effectively eliminate the factor which causes the crystal orientation irregularities.

Figure 5:
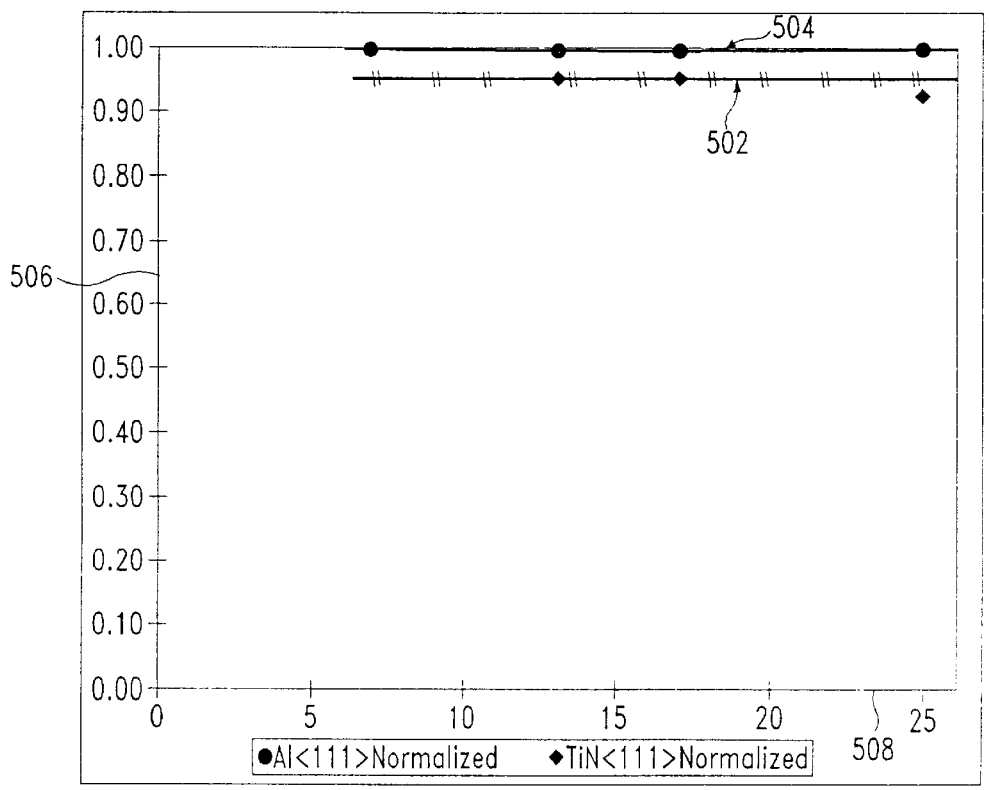
FIG. 5 shows the normalized XRD curve for an aluminum film and for the IMP-deposited TiN layer on which the aluminum film was deposited, as a function of the number of wafers processed in succession in the barrier layer deposition chamber. These curves relate to a barrier layer which was formed using the method of the present invention.

FIG. 5, shows the normalized XRD intensity curve 502 for the <111> crystal orientation content of the TiN layer of a Ti/TiN/TiN$_x$ barrier layer, and the normalized XRD intensity curve 504 for the <111> crystal orientation content of an overlying aluminum layer. The <111> crystal orientation content of the TiN layer was high and remained relatively constant (within testing error) as indicated by a normalized XRD intensity of about 0.94 for each wafer tested, beginning with wafer number 14 and extending through wafer 25, as shown in Curve 502. This behavior was mirrored in the overlying aluminum layer, which also exhibited a high and constant <111> crystal orientation content. This was indicated by a normalized XRD intensity of about 1.0 for each wafer tested, beginning with the 7th wafer (which was the first non-dummy wafer in this instance) and continuing through the 25th wafer, as indicated by curve 504.

The thickness of the first Ti layer of the structure for which data is presented in FIG. 5 was only 100 Å and the process conditions under which the structure was generated were generally the same as those for the structure for which data is presented in FIG. 3, with the exception of process chamber pressure. The process chamber pressure during the deposition of the barrier layer of FIG. 5 was only 10 mT compared with a process chamber pressure of 30 mT during the deposition of the barrier layer of FIG. 3. (There was a 10 second shorter deposition time after nitrogen cut off for the TiN$_x$ layer of the FIG. 5 barrier layer, but this is considered to be insignificant and should not result in an improvement in the overlying aluminum <111> crystal orientation content in any case.) We believe the improvement in the <111> crystal orientation content of the TiN layer illustrated in FIG. 5 (and in the overlying aluminum <111> crystal orientation content) is attributable to the elimination of the factor which would otherwise cause irregularities in the first Ti layer crystal orientation as that layer is formed.

EXAMPLE FIVE

With reference to barrier layers having a first Ti layer of substantial thickness, 200 Å or greater for example, where process pressures of 10 mT or higher are known to be acceptable during deposition of this layer, we have discovered a preferred operational pressure which is dependent upon the DC power to the Ti target. We have discovered that the XRD intensity (indicating the desired <002> crystal orientation) for the Ti layer is unexpectedly lower at 20 mT than it is at 10 or at 30 mT when the DC power to the Ti target is moderately low. The reverse is true when the DC power to the Ti target is higher.

Figure 6:
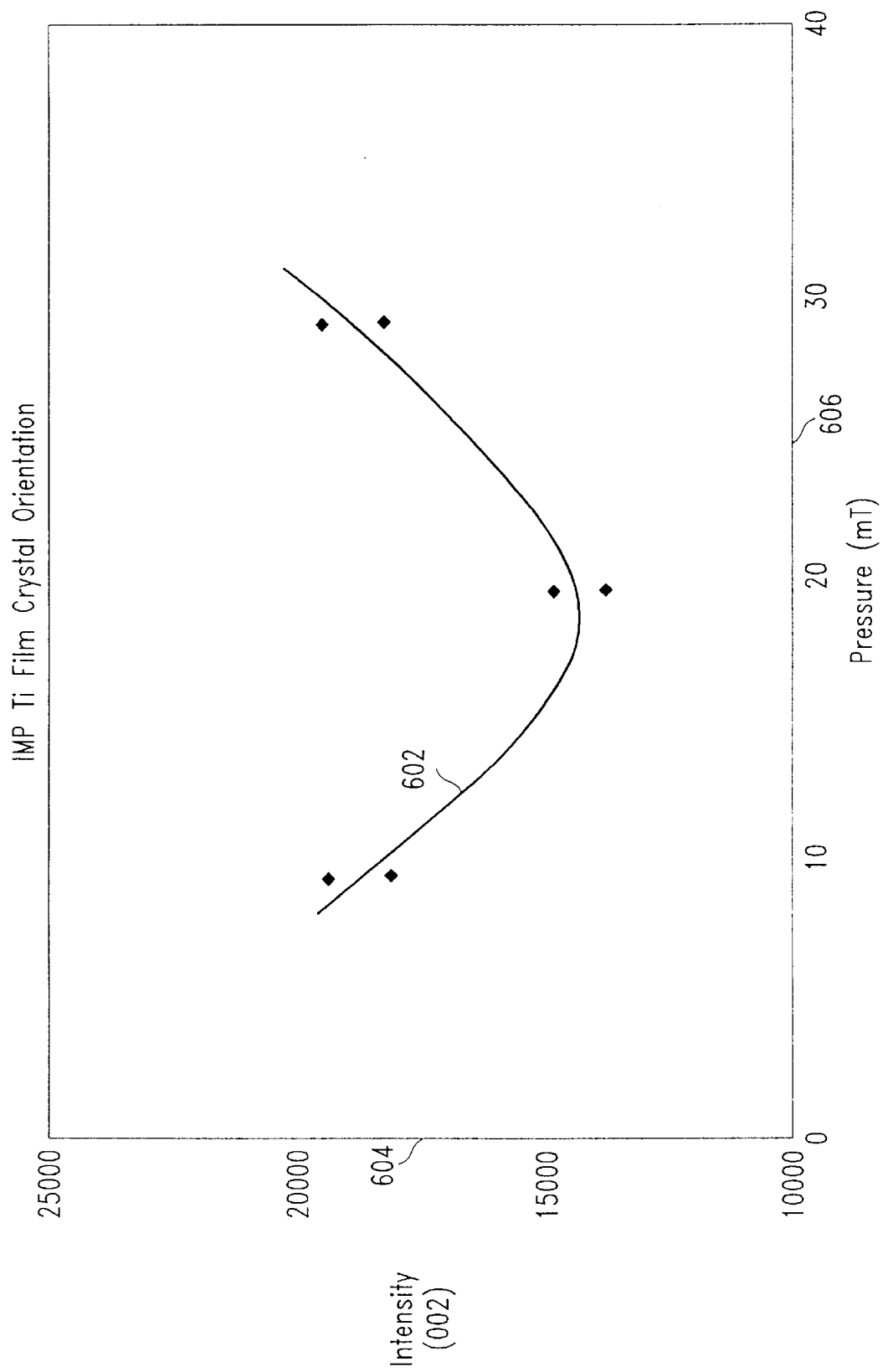
FIG. 6 shows the XRD intensity curve for an IMP-deposited Ti layer as a function of the deposition chamber pressure, when the power input to the Ti target is in the range of 3 kW to 5 kW. This curve is for a Ti layer which is 1,000 Å thick.

FIG. 6 shows the XRD intensity 604 as a function of process chamber pressure 606 for a 1,000 Å thick Ti layer. The Ti layer was deposited at an RF induction coil power of 1–2 kW, a DC power to the Ti target of 3–5 kW, with no substrate bias power applied, and at a substrate temperature of about 200° C. Curve 602 shows that the <002> crystal orientation content of the Ti layer decreases unexpectedly between the process chamber pressures of 30 mT and 10 mT, when the DC power to the Ti target is 5 kW or less.

The above described preferred embodiments are not intended to limit the scope of the present invention, as one skilled in the art can, in view of the present disclosure expand such embodiments to correspond with the subject matter of the invention claimed below.

We claim:

1. A method of fabricating a Ti-comprising barrier layer structure on a semiconductor substrate, during the sequential processing of a series of said substrates through a barrier layer fabrication chamber to provide control of the <111> crystal orientation content of an aluminum layer subsequently deposited thereover, said method comprising: depositing a first layer of Ti or TiN upon said semiconductor substrate, wherein said first layer of Ti exhibits a <002> normalized XRD intensity of at least about 0.75, or said first layer of TiN exhibits a <111> normalized XRD intensity of at least about 0.85, for at least 70% of said semiconductor structures processed in a continuous series through said barrier layer structure fabrication chamber.

2. The method of claim 1, wherein the thickness of said first layer of Ti or TiN is at least 150 Å thick.

3. The method of claim 2, wherein a pressure in said fabrication chamber during the deposition of said first layer of Ti or TiN is less than about 30 mT.

4. The method of claim 3, wherein said pressure is less than about 20 mT.

5. The method of claim 4, wherein said pressure is less than about 10 mT.

6. The method of claim 1, wherein a pressure within said fabrication chamber during the deposition of said first layer of Ti or TiN is less than about 10 mT.

7. A method of fabricating a Ti-comprising barrier layer structure on a semiconductor substrate, during sequential processing of a series of said substrates through a barrier layer fabrication chamber to provide control of the <111> crystal orientation content of an aluminum layer subsequently deposited thereover, said method comprising: depositing a first layer of Ti-comprising material upon said semiconductor substrate to a thickness of at least about 150 Å.

8. The method of claim 7, wherein said Ti-comprising material is selected from the group consisting of Ti, TiN, and TiN$_x$.

9. The method of claim 8, wherein said first layer is Ti and wherein a second layer of Ti-comprising material is deposited over said Ti layer, wherein said second layer is TiN or $TiN_x$.

10. A method of fabricating a Ti-comprising barrier layer structure on a semiconductor substrate, during sequential processing of a series of said substrates through a barrier layer fabrication chamber, to provide control of the <111> crystal orientation content of an aluminum layer subsequently deposited thereover, said method comprising: depositing a first layer of Ti-comprising material on said semiconductor substrate at a pressure of about 20 mT or less.

11. The method of claim 10, wherein said Ti-comprising material is selected from the group consisting of Ti, TiN, and $TiN_x$.

12. The method of claim 11, wherein said first layer is Ti and wherein a second layer of Ti-comprising material is deposited over said Ti layer, wherein said second layer is TiN or $TiN_x$.

13. The method of claim 10 wherein said deposition pressure for said first layer of Ti-comprising material is less than about 10 mT.

14. The method of claim 11 wherein said deposition pressure for said first layer of Ti-comprising material is less than about 10 mT.

15. The method of claim 12, wherein said deposition pressure for said first layer of Ti-comprising material is less than about 10 mT.

16. A method of fabricating a Ta-comprising barrier layer structure on a semiconductor substrate, during sequential processing of a series of said substrates through a barrier layer fabrication chamber, to provide control of the <111> crystal orientation content of a copper layer subsequently deposited thereover, said method comprising: depositing a first layer of Ta or TaN upon said semiconductor substrate, wherein said first layer of Ta exhibits a <111> normalized XRD intensity of at least about 0.75, or said first layer of TaN exhibits a <111> normalized XRD intensity of at least about 0.85, for at least 70% of said semiconductor structures processed in a continuous series through said barrier layer structure fabrication chamber.

17. The method of claim 16, wherein the thickness of said first layer of Ta or TaN is at least 150 Å thick.

18. The method of claim 17, wherein a pressure in said fabrication chamber during the deposition of said first layer of Ta or TaN is less than about 30 mT.

19. The method of claim 18, wherein said pressure is less than about 20 mT.

20. The method of claim 19, wherein said pressure is less than about 10 mT.

21. The method of claim 16, wherein a pressure within said fabrication chamber during the deposition of said first layer of Ta or TaN is less than about 10 mT.

22. A method of fabricating a Ta-comprising barrier layer structure on a semiconductor substrate, during sequential processing of a series of said substrates through a barrier layer fabrication chamber, to provide control of the <111> crystal orientation content of a copper layer subsequently deposited thereover, said method comprising: depositing a first layer of Ta-comprising material upon said semiconductor substrate to a thickness of at least about 150 Å.

23. The method of claim 22, wherein said Ta-comprising material is selected from the group consisting of Ta, TaN, and $TaN_x$.

24. The method of claim 23, wherein said first layer is Ta and wherein a second layer of Ta-comprising material is deposited over said Ta layer, wherein said second layer is TaN or $TaN_x$.

25. A method of fabricating a Ta-comprising barrier layer structure on a semiconductor substrate, during sequential processing of a series of said substrates through a barrier layer fabrication chamber, to provide control of the <111> crystal orientation content of a copper layer subsequently deposited thereover, said method comprising: depositing a first layer of Ta-comprising material on said semiconductor substrate at a pressure of about 20 mT or less.

26. The method of claim 25, wherein said Ta-comprising material is selected from the group consisting of Ta, TaN, and $TaN_x$.

27. The method of claim 26, wherein said first layer is Ta and wherein a second layer of Ta-comprising material is deposited over said Ta layer, wherein said second layer is TaN or $TaN_x$.

28. The method of claim 25 wherein said deposition pressure for said first layer of Ta-comprising material is less than about 10 mT.

29. The method of claim 26 wherein said deposition pressure for said first layer of Ta-comprising material is less than about 10 mT.

30. The method of claim 27, wherein said deposition pressure for said first layer of Ta-comprising material is less than about 10 mT.

* * * * *

UNITED STATES PATENT AND TRADEMARK OFFICE
CERTIFICATE OF CORRRECTION

PATENT NO. : 5,882,399
DATED : March 16, 1999
INVENTOR(S) : Kenny King-tai Ngan, et al.

It is certified that error appears in the above-identified patent and that said Letters Patent is hereby corrected as shown below:

Title page, item [56] References Cited, insert the following:

FOREIGN PATENT OR PUBLISHED FOREIGN PATENT APPLICATION

| | | DOCUMENT NUMBER | | | | | PUBLICATION DATE | NAME | CLASS | SUBCLASS | TRANSLATION YES | NO |
|---|---|---|---|---|---|---|---|---|---|---|---|---|
| | EP | 0 | 4 | 0 | 7 | 1 | 3 | 3 | 01/09/91 | Hasunama et al | H01L | 23/532 | | |
| | EP | 0 | 7 | 1 | 7 | 4 | 3 | 6 | 06/19/96 | Hedge et al | H01L | 21/285 | | |
| | EP | 0 | 8 | 1 | 8 | 5 | 5 | 6 | 01/14/98 | Ngan et al | C23C | 14/34 | | |

OTHER DOCUMENTS(Including Author, Title, Date, Pertinent Pages, Etc.)

| |
|---|
| N. Kumar et al., "Growth and properties of radio frequency reactively sputtered titanium nitride thin films", *J. Vac. Sci. Technol.* A, Vol. 5, No. 4, pp. 1778-1782(Jul/Aug 1987). |
| Copy of International Search Report for PCT Application No. PCT/US98/17503, which is the corresponding application of the present U.S. application. |

Signed and Sealed this

Sixth Day of June, 2000

*Attest:*

Q. TODD DICKINSON

*Attesting Officer*   *Director of Patents and Trademarks*